United States Patent [19]

Segaram

[11] Patent Number: 5,357,145
[45] Date of Patent: Oct. 18, 1994

[54] INTEGRATED WAVESHAPING CIRCUIT USING WEIGHTED CURRENT SUMMING

[75] Inventor: Para K. Segaram, Campbell, Calif.

[73] Assignee: National Semiconductor Corporation, Santa Clara, Calif.

[21] Appl. No.: 994,660

[22] Filed: Dec. 22, 1992

[51] Int. Cl.$^5$ ............................................. H03K 5/01
[52] U.S. Cl. .................... 307/268; 307/498; 307/529; 328/104
[58] Field of Search ............... 307/268, 270, 498, 529; 328/105, 158, 104, 103

[56] References Cited

U.S. PATENT DOCUMENTS

| | | | |
|---|---|---|---|
| 3,390,283 | 6/1968 | Hannigsberg | 307/268 |
| 3,504,290 | 3/1970 | Earle | 307/260 |
| 3,612,916 | 10/1971 | O'Neill | 328/105 |
| 3,659,207 | 4/1972 | Perreault | 307/260 |
| 3,889,198 | 6/1975 | Lighthall et al. | 307/260 |
| 4,675,546 | 6/1987 | Shaw | 307/268 |

FOREIGN PATENT DOCUMENTS

| | | | |
|---|---|---|---|
| 3418213 | 11/1985 | Fed. Rep. of Germany | 307/268 |
| 1190493 | 11/1985 | U.S.S.R. | 307/268 |

Primary Examiner—Timothy P. Callahan
Assistant Examiner—Terry D. Cunningham
Attorney, Agent, or Firm—Limbach & Limbach

[57] ABSTRACT

A waveshaping circuit, which includes a phase-lock-loop stage, an input logic stage, a delayed input logic stage, and a weighted current sum stage, shapes and filters a data signal to be transmitted onto the twisted-pair media of a local area network. The phase-lock-loop stage generates a series of incrementally-delayed timing signals in response to an oscillator signal. The input logic stage generates a plurality of pairs of logic signals by periodically latching a logic state and an inverse logic state of the data signal in response to the incrementally-delayed timing signals. The delayed input logic stage generates a plurality of pairs of delayed logic signals by periodically latching a logic state and an inverse logic state of an inverse data signal in response to the incrementally-delayed timing signals. The weighted current sum stage incrementally generates both an output data signal and a complementary output data signal in response to both the plurality of logic signals and the plurality of delayed logic signals.

14 Claims, 9 Drawing Sheets

INTEGRATED WAVESHAPING CIRCUIT USING WEIGHTED CURRENT SUMMING

RELATED APPLICATION

The present application is related to commonly-assigned U.S. patent application Ser. No. 07/995,193 filed by Para K. Segaram of even date herewith, for DIFFERENTIAL OUTPUT STAGE WITH REDUCED IDLE CURRENT and commonly-assigned U.S. patent application Ser. No. 07/995,598, filed by Prasun K. Paul of even date herewith, for AN ARCHITECTURE FOR A CODING AND TRANSCEIVING ETHERNET CIRCUIT. The referenced related applications are hereby incorporated by reference to provide additional background information regarding the present invention.

BACKGROUND OF THE INVENTION

1. Field of the Invention

The present invention relates to semiconductor integrated circuits and, in particular, to the integration of external waveshaping functions onto an integrated circuit which drives a data signal onto the twisted-pair transmission medium of a local area network.

2. Description of the Related Art

A local area network is a communication system that allows personal computers, workstations, servers, and other devices within a small area, such as a single building or a group of buildings, to transfer information between each other. Each device connected to the network communicates with other devices on the network by following a standard which defines the operation of the network. One of the most widely accepted standards for local area networks is the IEEE 802.3 Ethernet Protocol.

The IEEE 802.3 Ethernet Protocol defines four physical layer specifications which differ primarily in the physical cables utilized. Coaxial cables are defined by a Thick Coax Ethernet (10BASE5) specification, which utilizes a double-shielded coaxial cable, and a Thin Coax Ethernet (10BASE2) specification, which utilizes a single-shielded coaxial cable. Twisted pair cables are defined by a Twisted Pair Ethernet (10BASE-T) specification and a StarLAN (1BASE5) specification.

One aspect of a twisted-pair network which is defined by the twisted-pair specification is the transmit waveform of the data signal. The data signal, which is Manchester-encoded, is shaped in accordance with the twisted-pair specification both to generate a defined amplitude step when the data signal transitions from either a logic one to a logic zero or from a logic zero to a logic one and to attenuate the higher harmonic components of the data signal.

The data signal is typically transmitted onto a twisted-pair cable by first Manchester-encoding the data signal to form an input data signal TX+ and a complementary input data signal TX−. A delayed input data signal TXd+ and a complementary delayed input data signal TXd− are then formed in response to the input data signal TX+ and the complementary input data signal TX−, respectively, by delaying both the input data signal TX+ and the complementary data signal TX− by one-half period.

Next, the four input data signals TX+, TX−, TXd+, and TXd− are resistively combined and filtered to form an output data signal Vin+ and a complementary output data signal Vin−. The resistive combination and filtering shape the transmit waveform to provide the defined amplitude step and the required attenuation. A transmit output waveform is then generated on the twisted-pair cable by feeding the output data signals Vin+ and Vin− into a transformer connected to the twisted-pair cable.

Figure 1:
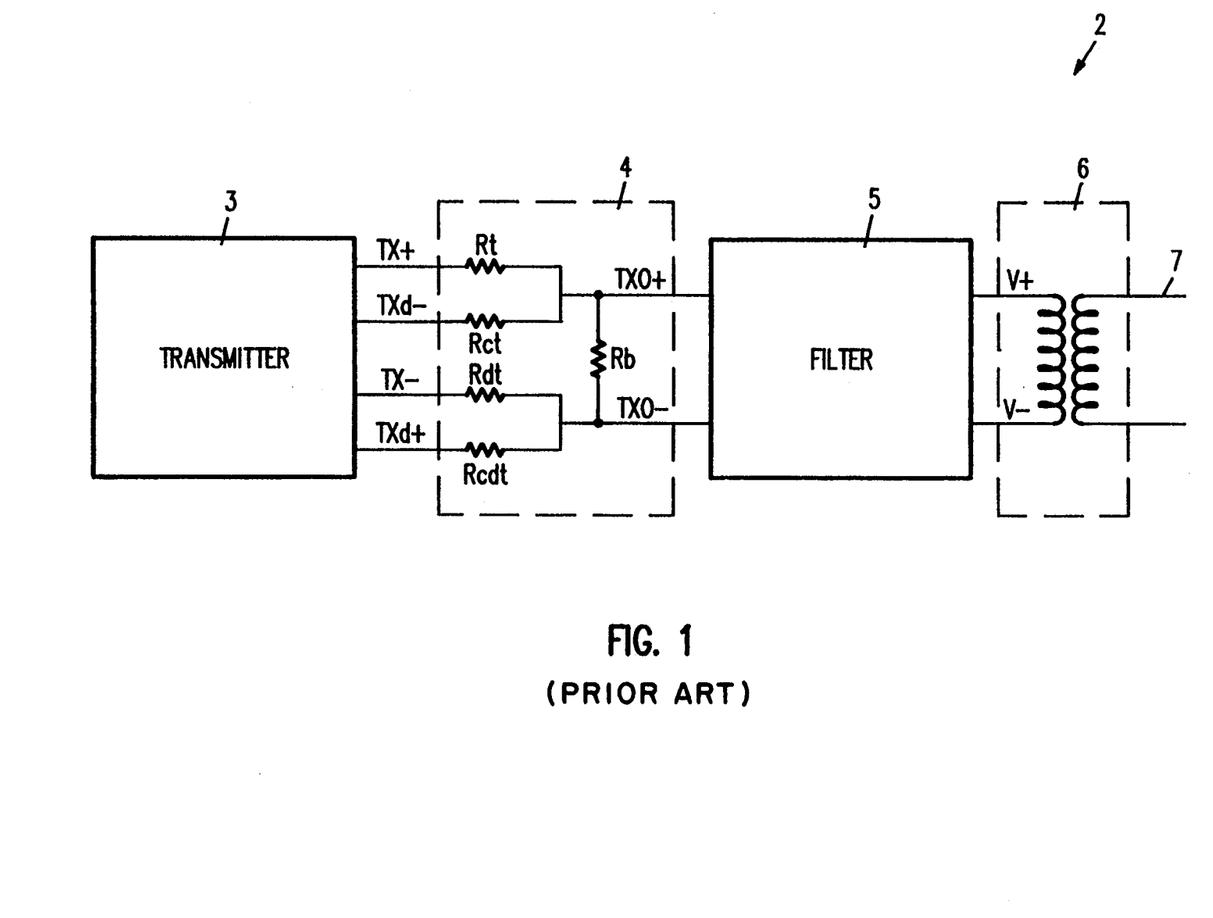
FIG. 1 shows a commonly utilized circuit 2 for resistively combining and filtering the input data signals TX+, TX−, TXd+, and TXd−.

FIG. 1 shows a commonly utilized circuit 2 for resistively combining and filtering the input data signals TX+, TX−, TXd+, and TXd−. As shown in FIG. 1, a transmission stage 3, which is typically packaged as an integrated circuit, drives the input data signals TX+, TX−, TXd+, and TXd− onto an external summing resistor network 4 as square-wave current signals.

The external summing resistor network 4 includes an input resistor Rt, a complementary input resistor Rct, a delayed input resistor Rdt, a complementary delayed input resistor Rcdt, and a balancing resistor Rb. The summing resistor network 4 generates both a square-wave transmit voltage signal TXO+ and a square-wave complementary transmit voltage signal TXO− by summing together the voltages generated by driving the input data signal TX+ and the complementary delayed input data signal TXd− across the input resistor Rt and the complementary delayed resistor Rcdt, respectively, and by summing together the voltages generated by driving the complementary input data signal TX− and the delayed input data signal TXd+ across the complementary input resistor Rct and the delayed input resistor Rdt, respectively.

An external filter 5, which is typically implemented as a conventional low-pass L-C filter, generates the output data signal Vin+ and a complementary output data signal Vin− by attenuating the harmonic components of both the square-wave transmit voltage signal TXO+ and the square-wave complementary transmit voltage signal TXO−.

The output data signal Vin+ and the complementary output data signal Vin− are then fed into an external 2:1 transformer 6, which isolates the preceding circuitry 3, 4, and 5 from a twisted-pair cable 7, to generate a transmitted waveform Tw on the twisted-pair cable 7.

Figure 2A:
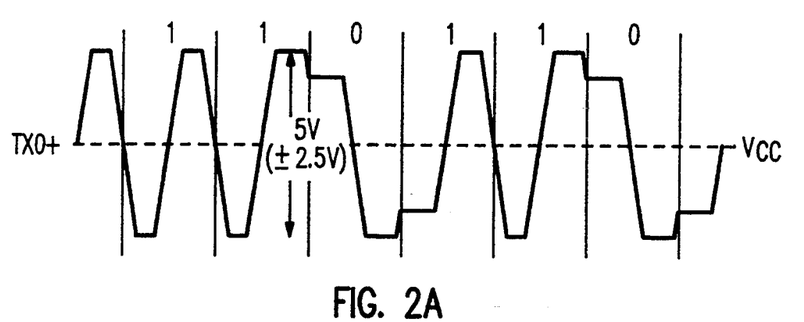
FIGS. 2A–C show an example of the transmit voltage signal TXO+, the complementary transmit voltage signal TXO−, and the transmitted waveform Tw.
Figure 2B:
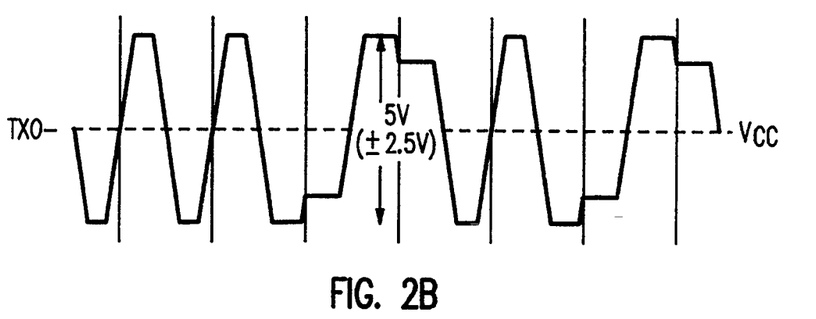
Figure 2C:
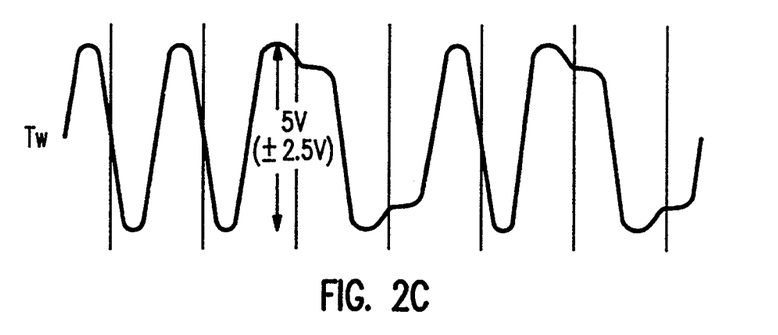

FIGS. 2A–C show an example of the transmit voltage signal TXO+, the complementary transmit voltage signal TXO−, and the transmitted waveform Tw. The transmit voltage signal TXO+ and the complementary transmit voltage signal TXO− are shown as 5 volt peak-to-peak signals centered at Vcc/2. The transmitted waveform Tw is shown as a +/−2.5 volt differential voltage signal in accordance with the twisted-pair specification.

One problem with utilizing the FIG. 1 circuit 2 is that since the harmonic components of the square-wave data signals TX+, TX−, TXd+, and TXd− are not attenuated prior to the external filter 5, the data signals TX+, TX−, TXd+, and TXd− radiate a significant amount of harmonic switching noise as a result of the high current levels utilized by the transmission stage 3 to drive the data signals TX+, TX−, TXd+, and TXd− onto the summing resistor network 4. The magnitude of the switching noise typically results in the FIG. 1 circuit 2 failing to satisfy FCC requirements for radiated emissions.

Another problem with utilizing the FIG. 1 circuit 2 is that the external resistor summing network 4 and the external filter 5 consume a substantial area on a circuit board.

Thus, there is a need to integrate the functionality of the transmission stage 3, the summing resistor network 4 and the filter 5 onto a single integrated circuit, thereby eliminating the harmonic switching noise radiated by the data signals TX+, TX−, TXd+, and TXd− and providing increased circuit board space.

SUMMARY OF THE INVENTION

In accordance with the present invention, a waveshaping circuit for generating an output data signal and a complementary output data signal in response to a input data signal, a delayed input data signal, and an oscillator signal is disclosed.

The present invention reduces radiated emissions and increases circuit board space by providing the functionality of the external summing resistor network and the external filter in a waveshaping circuit which can be packaged as a single integrated circuit.

The waveshaping circuit includes a phase-lock-loop stage that generates a plurality of incrementally-delayed timing signals in response to the oscillator signal. The plurality of incrementally-delayed timing signals can be formed, for example, by feeding the oscillator signal into a series of inverter gates which are controlled to have a substantially equivalent propagation delay between each inverter gate.

The waveshaping circuit further includes an input logic stage that generates a plurality of pairs of logic signals in response to the plurality of incrementally-delayed timing signals. Each timing signal generates one corresponding pair of logic signals by periodically latching the input data signal so that a logic state and an inverse logic state of the input data signal are simultaneously provided by the corresponding pair of logic signals.

The waveshaping circuit also includes a delayed input logic stage that generates a plurality of pairs of delayed logic signals in response to the plurality of incrementally-delayed timing signals. Each timing signal generates one corresponding pair of delayed logic signals by periodically latching the delayed input data signal so that a logic state and an inverse logic state of the delayed input data signal are simultaneously provided by the corresponding pair of delayed logic signals. The plurality of pairs of delayed logic signals correspond to the plurality of pairs of logic signals so that each pair of delayed logic signals corresponds to one pair of logic signals.

The waveshaping circuit additionally includes a weighted current sum stage that generates both the output data signal and the complementary output data signal in response to both the plurality of pairs of logic signals and the plurality of pairs of delayed logic signals.

Each pair of logic signals and its corresponding pair of delayed logic signals simultaneously generate both an incremental portion of the output data signal and an incremental portion of the complementary output data signal so that an instantaneous value of the output data signal is determined by summing together all the incremental portions of the output data signal while an instantaneous value of the complementary output data signal is also determined by summing together all the incremental portions of the complementary output data signal.

The output data signal and the complementary output data signal can be formed, for example, by providing an output resistor connected between a power supply and an output node, a complementary output resistor connected between the power supply and a complementary output node, and a plurality of current sources. Each current source receives one pair of the plurality of logic signals and its corresponding pair of delayed logic signals and simultaneously generates one of the incremental portions of the output data signal and one of the incremental portions of the complementary output data signal by sinking an incremental current through either the output resistor or the complementary output resistor in response to the one pair of the plurality of logic signals and its corresponding pair of delayed logic signals.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 9A and 9B show a graphical representation of the conceptual operation of weighted current sum stage 18.

DETAILED DESCRIPTION

Figure 3:
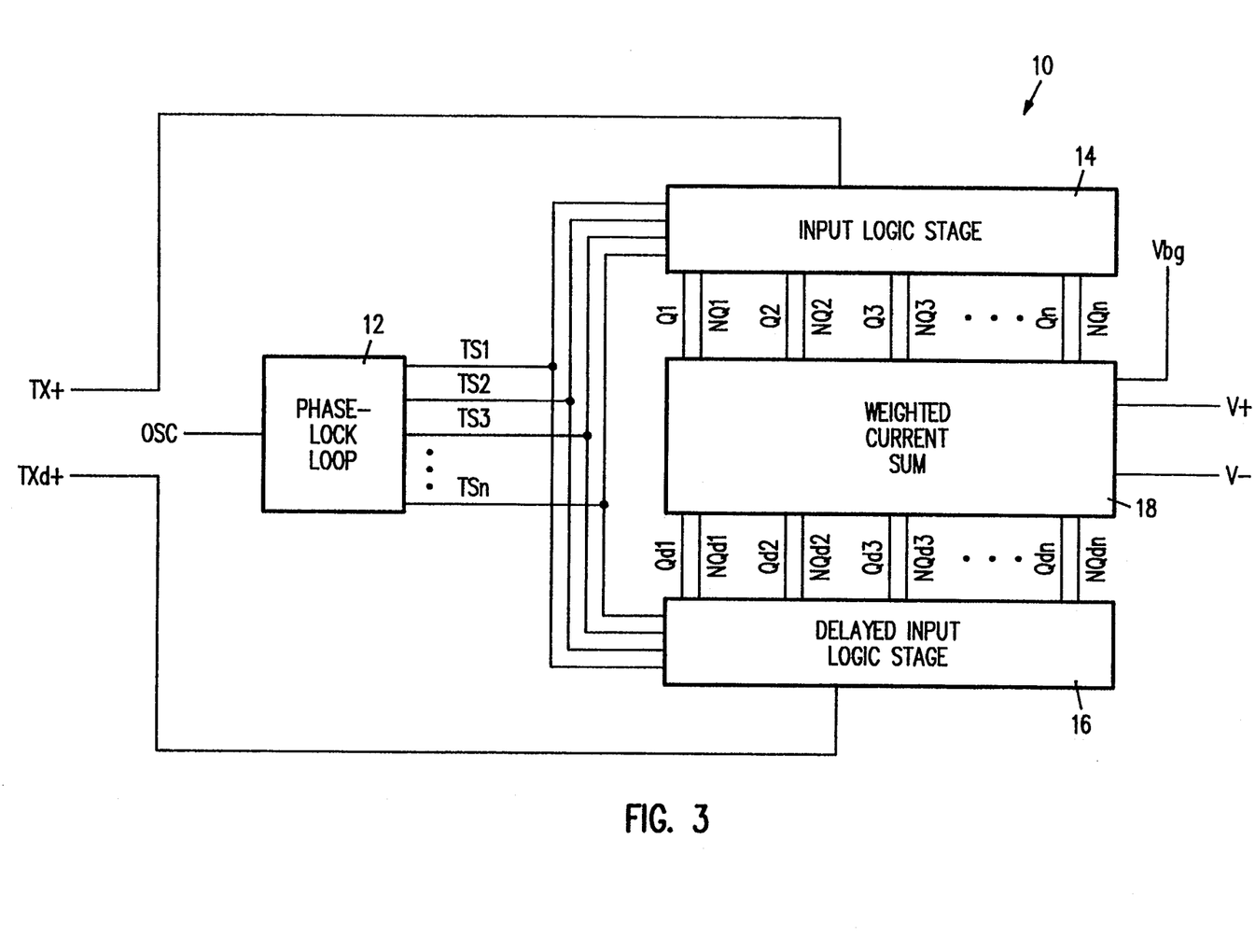
FIG. 3 shows an embodiment of a waveshaping circuit 10 in accordance with the present invention.

FIG. 3 shows an embodiment of a waveshaping circuit 10 in accordance with the present invention. In the FIG. 3 embodiment, waveshaping circuit 10 generates an output data signal Vin+ and a complementary output data signal Vin− in response to both an input data signal TX+ and a delayed input data signal TXd+ as defined by the twisted-pair (10BASE-T) specification of the IEEE 802.3 local area network standard.

As shown in FIG. 3, waveshaping circuit 10 includes a phase-lock-loop stage 12 that generates a series of incrementally-delayed timing signals TS1–TSn in response to an externally provided oscillator signal OSC, an input logic stage 14 that generates a series of pairs of complementary logic signals Q1/NQ1–Qn/NQn in response to the series of timing signals TS1–TSn and the input data signal TX+, a delayed input logic stage 16 that generates a series of pairs of complementary delayed logic signals Qd1/NQd1–Qdn/NQdn in response to the series of timing signals TS1–TSn and the delayed input data signal TXd+, and a weighted current sum stage 18 that generates the output data signal Vin+ and the complementary output data signal Vin− in response to both the series of pairs of complementary logic signals Q1/NQ1–Qn/NQn and the series of pairs of complementary delayed logic signals Qd1/NQd1–Qdn/NQdn.

Figure 4:
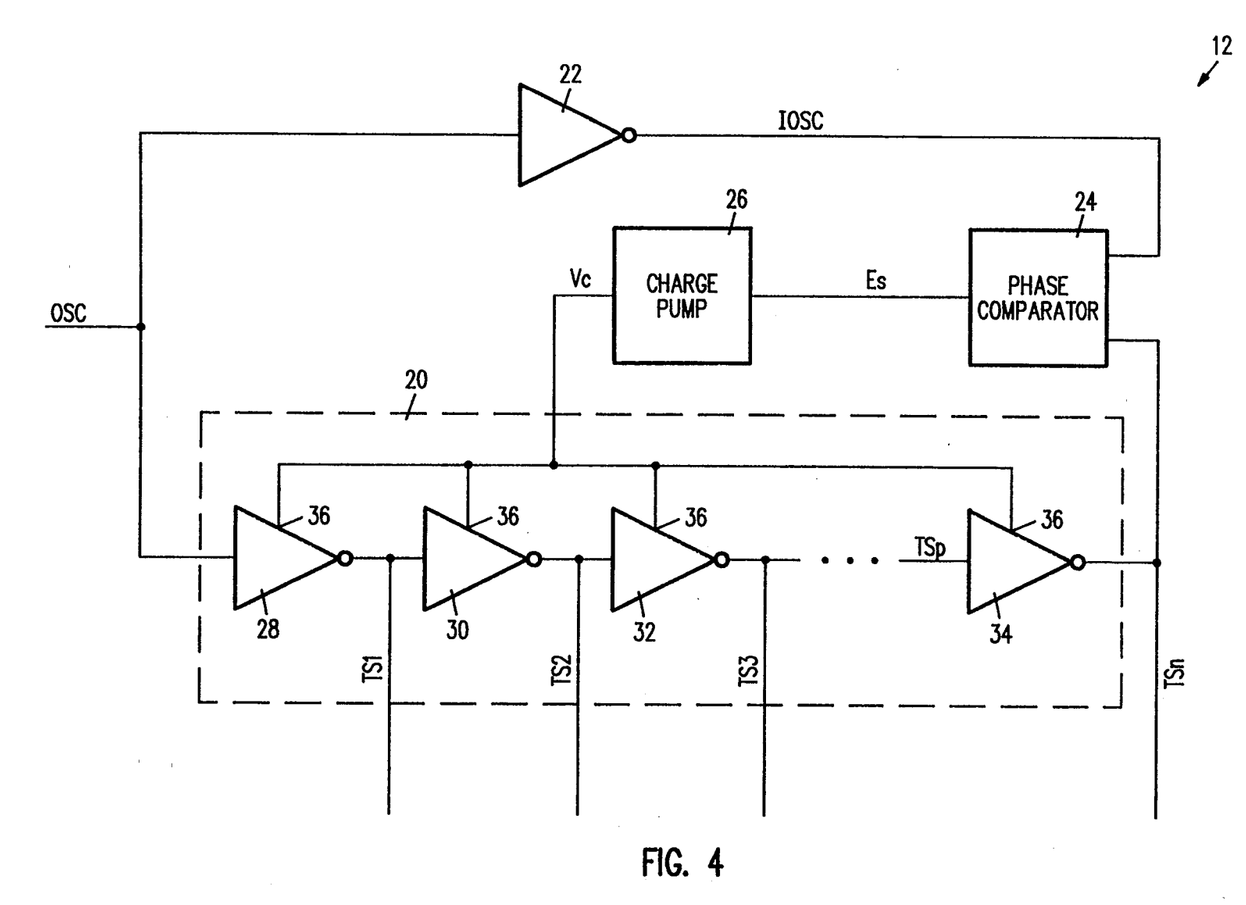
FIG. 4 shows a block diagram of an embodiment of a phase-lock-loop 12 in accordance with the present invention.

FIG. 4 shows a block diagram of an embodiment of phase-lock-loop stage 12 in accordance with the present invention. As shown in FIG. 4, phase-lock-loop stage 12 includes an inverter substage 20 that generates the series of incrementally-delayed timing signals TS1–TSn in response to the oscillator signal OSC and a control voltage Vc, an oscillator inverter 22 that generates an inverted oscillator signal IOSC, a phase comparator 24 that generates an error signal Es in response to a difference between the inverted oscillator signal IOSC and the nth timing signal TSn where the nth timing signal TSn represents the total number of timing signals generated by phase-lock-loop 12, and a charge pump 26 that generates the control voltage Vc in response to the error signal Es.

Inverter substage 20 is illustrated in FIG. 4 as a series of inverter gates including a first inverter gate 28, a second inverter gate 30, a third inverter gate 32, and a nth inverter gate 34 where nth inverter gate 34 corresponds to the nth timing signal TSn.

As further shown in FIG. 4, first inverter gate 28 generates the first timing signal TS1 in response to the oscillator signal OSC, second inverter gate 30 generates the second timing signal TS2 in response to the first timing signal TS1, and third inverter gate 32 generates the third timing signal TS3 in response to the second timing signal TS2. Similarly, the nth inverter gate 34 generates the nth timing signal TSn in response to a preceding timing signal TSp.

The first timing signal TS1 and each succeeding odd-numbered timing signal are equivalent to a time delayed inverse of the oscillator signal OSC where the time delay Td of each timing signal TS1–TSn is equivalent to the propagation delay introduced by each preceding inverter gate.

As described in greater detail below, the propagation delay of each inverter gate 28, 30, 32, and 34 is substantially equivalent. Thus, the delay time Td for each timing signal TS1–TSn is defined by:

$$Td = (n) * (\text{the propagation delay})$$

where n represents the total number of preceding inverter gates.

For example, when the logic state of the oscillator signal OSC changes from a logic low to a logic high, the logic state of the first timing signal TS1 will change from a logic high to a logic low after the propagation delay introduced by the first inverter gate 28 while the logic state of the third timing signal TS3 will change from a logic high to a logic low after the propagation delay introduced by the first three inverter gates 28, 30, and 32.

Similarly, the second timing signal TS2 and each succeeding even-numbered timing signal are equivalent to a time delayed oscillator signal where the time delay Td is defined as above. Thus, when the logic state of the oscillator signal OSC changes from a logic low to a logic high, the logic state of the second timing signal TS2 will change from a logic low to a logic high after the propagation delay introduced by the first two inverter gates 28 and 30.

The propagation delay of an inverter gate is a function of the input voltage, the channel width and length of the transistors used to fabricate the inverter gate, and the fabrication process. In the present invention, equivalent transistors are formed simultaneously in the fabrication process to have a substantially equivalent channel width and length. Thus, in the present invention, the propagation delay of each inverter gate 28, 30, 32, and 34 is determined principally by the input voltage.

As shown in FIG. 4, each inverter gate 28, 30, 32, and 34 has an input voltage terminal 36 which is connected to the control voltage Vc. Thus, the control voltage Vc sets an equivalent propagation delay across each of the inverter gates 28, 30, 32, and 34.

In the present invention, the control voltage Vc is controlled by the feedback action of oscillator inverter 22, phase comparator 24, and charge pump 26 so that the delay time Td of the nth timing signal is approximately one half of the period of the oscillator signal OSC.

As shown in FIG. 4, phase comparator 24 receives the inverted oscillator signal IOSC from oscillator inverter 22 and the nth timing signal TSn from the nth inverter gate 34, compares the two signals, and generates an error Es in response to a difference between the two signals. Charge pump 24 responds to the error signal Es by either increasing or decreasing the control voltage Vc.

The requirement for oscillator inverter 22 is dependent on whether the nth inverter gate 34 is an odd-numbered or an even-numbered inverter gate. When the logic state of the oscillator signal OSC transitions from a logic low to a logic high, the nth timing signal TSn will transition from a logic low to a logic high when the nth inverter gate 34 is even-numbered and will transition from a logic high to a logic low when the nth inverter gate 34 is odd-numbered.

Thus, in order to compare the falling edge of the oscillator signal OSC to the rising edge of an even-numbered nth timing signal TSn, the oscillator signal OSC must be inverted. As described in greater detail below, in the preferred embodiment of the present invention, 12 inverter gates are utilized.

By utilizing the feedback action of oscillator inverter 22, phase comparator 24, and charge pump 26 to generate a total propagation delay which is approximately one-half of the period of the oscillator signal OSC, a precise propagation delay, which is equivalent to the total number of inverter gates divided by one-half the period of the oscillator signal OSC, is generated.

As stated above, waveshaping circuit 10 generates the output data signal Vin+ and the complementary output data signal Vin− in response to both the input data signal TX+ and the delayed input data signal TXd+ in accordance with the twisted-pair specification of the IEEE 802.3 local area network standard. In the twisted-pair specification, the input data signal TX+ is defined as a 10 MHz (megahertz) Manchester-encoded signal. The delayed input data signal TXd+ is defined as a delayed 10 MHz Manchester-encoded signal where the delay is equivalent to one-half the period of the input data signal TX+ or 50 ns (nanoseconds).

In the preferred embodiment, a signal which is equivalent and synchronized to the input data signal TX+ is utilized as the oscillator signal OSC. Thus, in the preferred embodiment, a propagation delay of 4.167 ns results from dividing the 12 inverter gates of the preferred embodiment by the 50 ns one-half period of the oscillator signal OSC.

Therefore, for example, if the logic state of the oscillator signal OSC changes at t=0, then the logic state of the first timing signal TS1 will change approximately 4.167 ns later, the logic state of the second timing signal TS2 will change approximately 8.334 ns later, and the logic state of the twelfth timing signal will change approximately 50 ns later.

Figure 5:
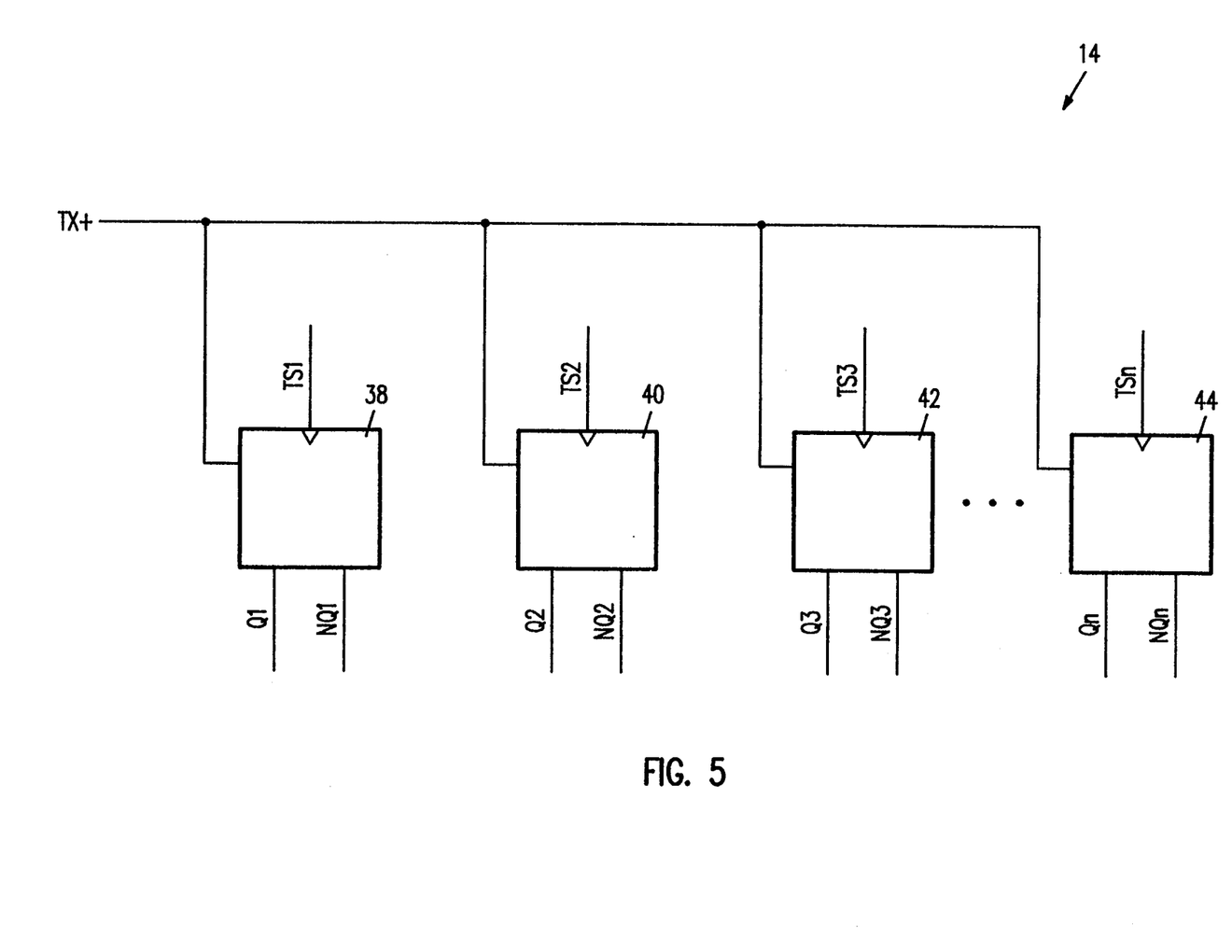
FIG. 5 shows an embodiment of an input logic stage 14 in accordance with the present invention.

FIG. 5 shows an embodiment of input logic stage 14. As shown in FIG. 5, input logic stage 14 generates the series of pairs of complementary logic signals Q1/NQ1-Qn/NQn in response to the series of timing signals TS1-TSn and the input data signal TX+. Each timing signal TS1-TSn generates one corresponding pair of complementary logic signals by periodically latching the input data signal TX+ so that the logic state and an inverse logic state of the input data signal TX+ are simultaneously provided by the one corresponding pair of complementary logic signals.

The transmit logic stage is illustrated in FIG. 5 as a series of logic blocks that includes a first logic block 38, a second logic block 40, a third logic block 42, and a nth logic block 44 where the nth logic block 44 corresponds to the nth inverter gate 34. As further shown in FIG. 5, first logic block 38 generates the first logic signal Q1 and the first complementary logic signal NQ1 in response to both the input data signal TX+ and the first timing signal TS1, second logic block 40 generates the second logic signal Q2 and the second complementary logic signal NQ2 in response to both the input data signal TX+ and the second timing signal TS2, and third logic block 42 generates the third transmit logic signal Q3 and the third complementary transmit logic signal NQ3 in response to both the input data signal TX+ and the third timing signal TS3. Similarly, the nth logic block 44 generates the nth transmit logic signal Qn and the nth complementary transmit logic signal NQn in response to both the input data signal TX+ and the nth timing signal TSn.

The logic blocks 38, 40, 42, and 44 are configured so that each of the logic signals Q1-Qn is equivalent to the period and logic state of the input data signal TX+ that exists when the logic state of each corresponding timing signal TS1-TSn transitions either from a logic low to a logic high or from a logic high to a logic low.

For example, if the logic state of the input data signal TX+ is high when the first timing signal TS1 transitions either from a logic low to a logic high or from a logic low to a logic high, the logic state of the first logic signal Q1 will also be high.

Similarly, the complementary logic signals NQ1-NQn are equivalent to the period and the inverse of the logic state of the input data signal TX+ that exists when the logic state of each corresponding timing signal TS1-TSn transitions either from a logic low to a logic high or from a logic high to a logic low.

In operation, since the oscillator signal OSC is synchronized to the input data signal TX+, when the logic state of the input data signal TX+ transitions from a logic low to a logic high, the logic state of the first timing signal TS1 will transition from a logic high to a logic low and the first logic signal Q1 will transition from a logic low to a logic high after a delay principally introduced by the first inverter gate 28 (see FIG. 4).

Similarly, the logic state of the second timing signal TS2 and the second logic signal Q2 will transition from a logic low to a logic high after a delay principally introduced by the first two inverter gates 28 and 30 (see FIG. 4).

Therefore, when the logic state of the input data signal TX+ transitions from a logic low to a logic high, each logic signal Q1-Qn will transition to a logic high and each complementary logic signal NQ1-NQn will transition to a logic low after the delay time associated with its corresponding inverter gate.

Figure 6:
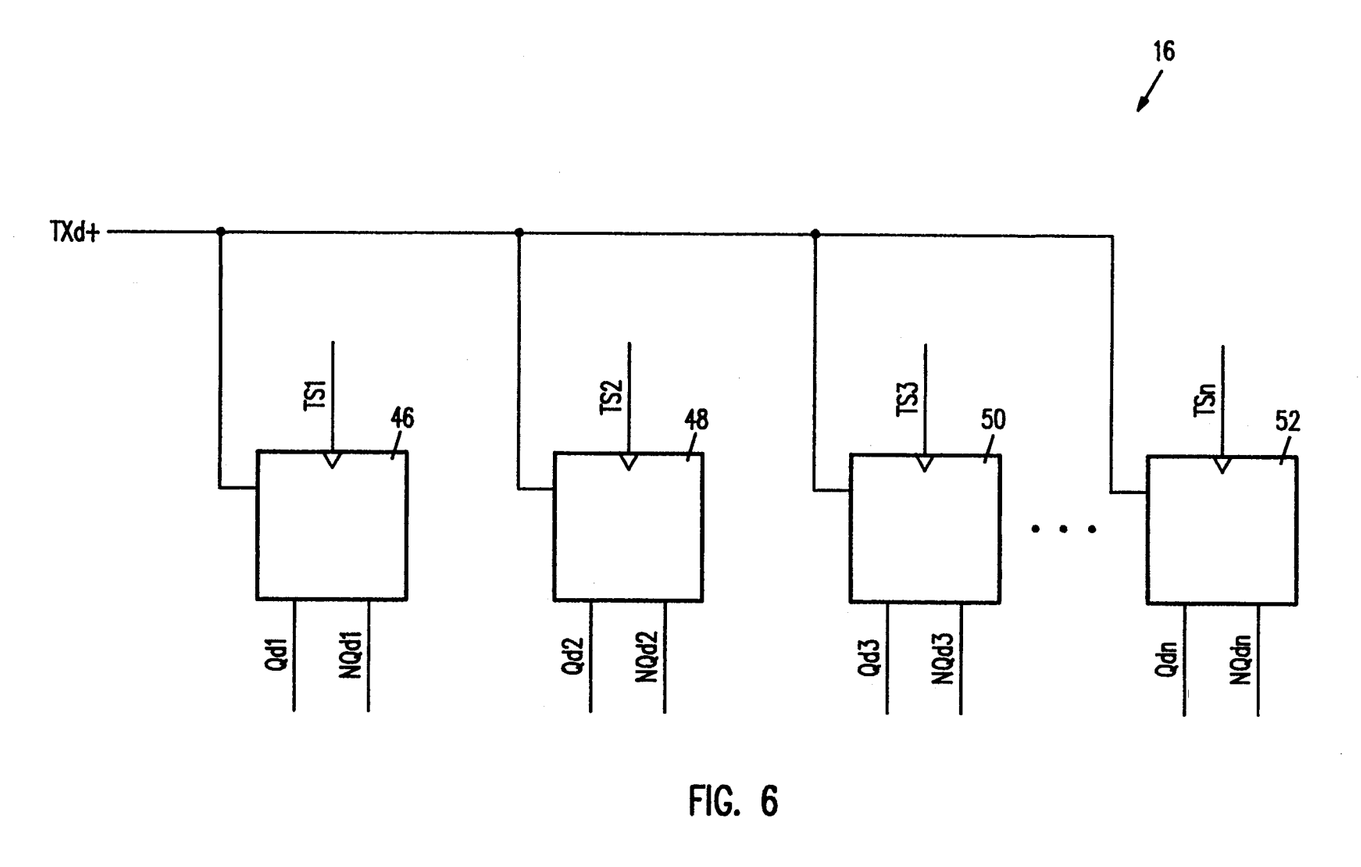
FIG. 6 shows an embodiment of a delayed input logic stage 16 in accordance with the present invention.

FIG. 6 shows an embodiment of delayed input logic stage 16 in accordance with the present invention. As can be seen in FIG. 6, the configuration of delayed input logic stage 16, which includes a series of delayed logic blocks including a first delayed logic block 46, a second delayed logic block 48, a third delayed logic block 50, and an nth delayed logic block 52, is substantially identical to the configuration of input logic stage 14 as shown in FIG. 5. The only difference between the logic stage 14 and delayed input logic stage 16 is that the series of pairs of complementary delayed logic signals Qd1/NQd1-Qdn/NQdn are generated in response to the series of timing signals TS1-TSn, respectively, and the delayed input data signal TXd+.

As with input logic stage 14, the logic blocks 46, 48, 50, and 52 are configured so that each of the delayed input logic signals Qd1-Qdn is equivalent to the logic state of the delayed input data signal TXd+ that exists when the logic state of each corresponding timing signal TS1-TSn transitions either from a logic low to a logic high or from a logic high to a logic low.

Since the delayed input data signal TXd+ is delayed one-half a period from the input data signal TX+, when the logic state of the input data signal TX+ transitions from a logic low to a logic high, each delayed input logic signal Qd1-Qdn will transition to a logic high and each complementary delayed transmit logic signal NQd1-NQdn will transition to a logic low after both the delay time associated with its corresponding inverter gate and the one-half period delay.

As shown in FIGS. 5 and 6, the series of pairs of complementary delayed logic signals Qd1/NQd1-Qdn-NQdn corresponds to the series of pairs of complementary logic signals Q1/NQ1-Qn/NQn so that each pair of delayed logic signals corresponds to one pair of logic signals.

Figure 7:
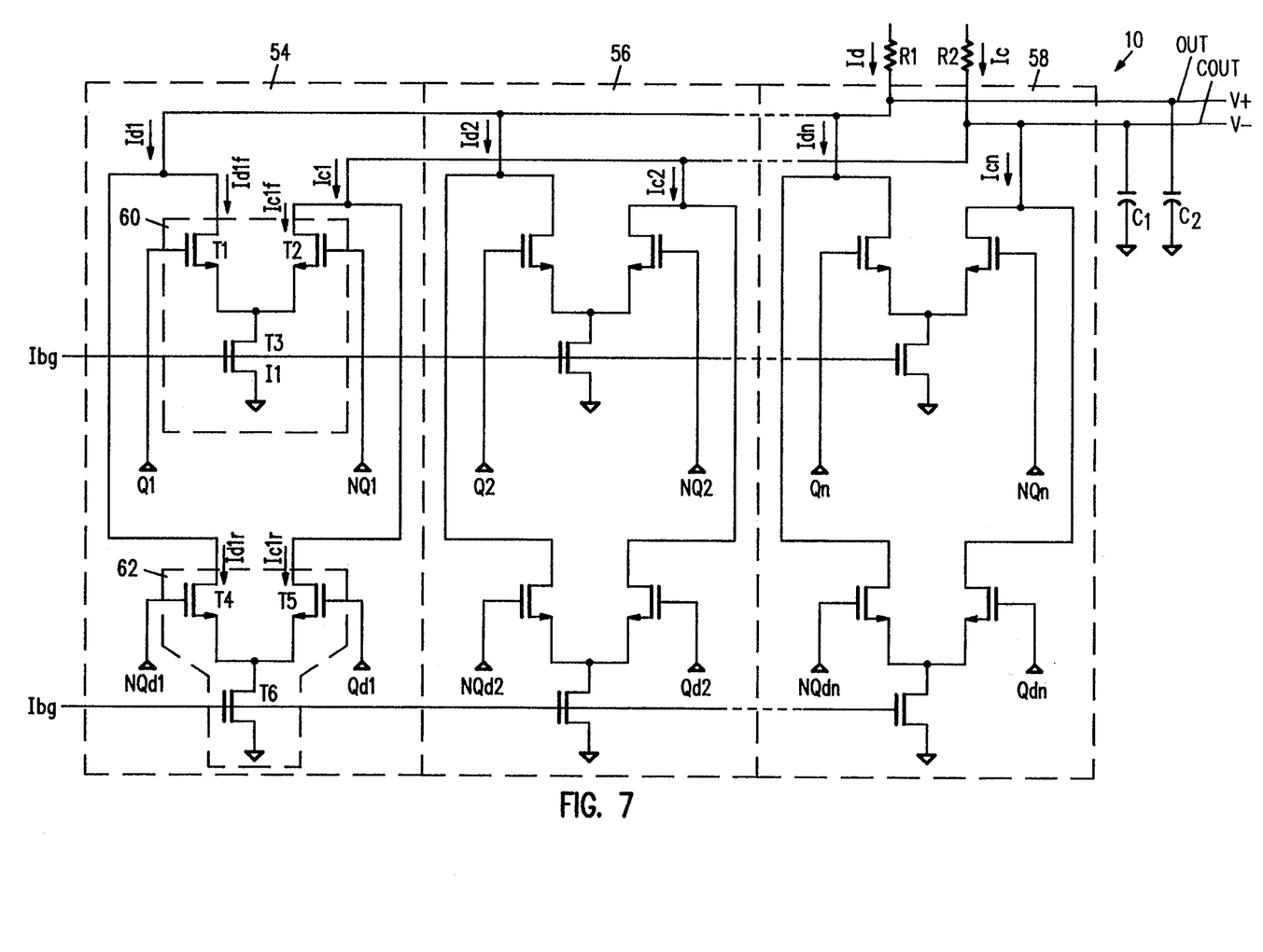
FIG. 7 shows a schematic diagram of an embodiment of a weighted current sum stage 18 in accordance with the present invention.

FIG. 7 shows a schematic diagram of an embodiment of weighted current sum stage 18 in accordance with the present invention. Weighted current sum stage 18 generates the output data signal Vin+ and the complementary output data signal Vin− in response to both the plurality of pairs of complementary logic signals Q1/NQ1-Qn/NQn and the plurality of pairs of complementary delayed logic signals Qd1/NQd1-Qdn-NQdn.

Each pair of logic signals Q/NQ and its corresponding pair of delayed logic signals Qd/NQd simultaneously generate both an incremental portion of the output data signal Vin+ and an incremental portion of the complementary output data signal Vin−. Thus, the instantaneous value of the output data signal Vin+ is determined by summing together all the incremental portions of the output data signal Vin+ while the instantaneous value of the complementary output data signal Vin− is also determined by summing together all the incremental portions of the complementary output data signal Vin−.

Weighted current sum stage 18 is illustrated in FIG. 7 as an output resistor R1 connected between a power supply Vdd and an output node OUT, a complementary output resistor R2 connected between the power supply Vdd and a complementary output node COUT, and a series of current sources including a first current source 54, a second current source 56, and a nth current source 58 where the nth current source corresponds to the nth logic signals Qn, NQn, Qdn, and NQdn.

Each current source 54, 56, and 58 generates the portion of the output data signal Vin+ and the portion of the complementary output data signal Vin− by sinking either one of a plurality of incremental data currents Id1–Idn through the output resistor R1 or one of a plurality of complementary data currents Ic1–Icn through the complementary output resistor R2, respectively.

The series of incremental data currents Id1–Idn, each of which corresponds to one of the current sources 54, 56, and 58, are illustrated in FIG. 7 as a first incremental data current Id1, a second incremental data current Id2, and a nth incremental data current Idn where the nth incremental data current Idn corresponds to the nth current source 58.

Similarly, the series of complementary incremental data currents Ic1–Icn, each of which also corresponds to one of the current sources 54, 56, and 58, are illustrated in FIG. 7 as a first complementary incremental data current Ic1, a second complementary incremental data current Ic2, and a nth complementary incremental data current Icn where the nth complementary incremental data current Icn corresponds to the nth current source 58.

As shown in FIG. 7, the first current source 54 sinks either the first incremental data current Id1 or the first complementary incremental data current Ic1, the second current source 56 sinks either the second incremental data current Id2 or a second complementary incremental data current Ic2, and the nth current source 58 sinks either the nth incremental data current Idn or the nth complementary incremental data current Icn.

As further shown in FIG. 7, the first current source 54 includes a data differential pair 60 and a delayed differential pair 62. Data differential pair 60 sinks either a first portion Id1f of the first incremental data current Id1 or a first portion Ic1f of the first complementary incremental data current Ic1 while delayed differential pair 62 sinks either a remaining portion Id1r of the first incremental data current Id1 or a remaining portion Ic1r of the first complementary incremental data current Ic1.

First differential pair 60 includes a first n-channel input transistor T1, a first n-channel complementary input transistor T2, and a first tail current transistor T3. As further shown in FIG. 7, input transistor T1 has its source connected to ground through first tail current transistor T3, its drain connected to a power supply Vdd through the output resistor R1, and its gate connected to receive the first logic signal Q1.

Complementary input transistor T2 has its source connected to ground through first tail current transistor T3, its drain connected to the power supply Vdd through the complementary output resistor R2, and its gate connected to receive the first complementary logic signal NQ1. First tail current transistor T3 has its source connected to ground and its gate connected to a bandgap reference current Ibg. First tail current transistor T3 sinks either the first portion Id1f of the first incremental data current Id1 or the first portion Ic1f of the first complementary incremental data current Ic1.

First delayed differential pair 62 includes a first n-channel delayed complementary input transistor T4, a first n-channel delayed input transistor T5, and a first delayed tail current transistor T6. Delayed complementary input transistor T4 has its source connected to ground through first delayed tail current transistor T6, its drain connected to the power supply Vdd through the output resistor R1, and its gate connected to receive the first delayed complementary logic signal NQd1.

First delayed input transistor T5 has its source connected to ground through first delayed tail current transistor T6, its drain connected to the power supply Vdd through the complementary output resistor R2, and its gate connected to receive the first delayed logic signal Qd1. First delayed tail current transistor T6 has its source connected to ground and its gate connected to the bandgap reference current Ibg. First delayed tail current transistor T6 sinks either the remaining portion Id1r of the first incremental data current Id1 or the remaining portion Ic1r of the first complementary incremental data current Ic1. The magnitude of the remaining portions of the incremental currents are approximately one-third the magnitude of the first portions of the incremental currents.

In operation, as stated above, when the logic state of the input data signal TX+ transitions from a logic low to a logic high, each logic signal Q1–Qn will transition to a logic high and each complementary logic signal NQ1–NQn will transition to a logic low after the delay time associated with its corresponding inverter gate and each delayed logic signal Qd1–Qdn will transition to a logic high and each complementary delayed logic signal NQd1–NQdn will transition to a logic low after both the delay time associated with its corresponding inverter gate and the one-half period delay.

When the first logic signal Q1 transitions from a logic low to a logic high and the first complementary logic signal NQ1 transitions from a logic high to a logic low, the gate-to-source voltage of input transistor T1 increases while the gate-to-source voltage of complementary input transistor T2 simultaneously decreases. As the gate-to-source voltage of the input transistor T1 increases and the gate-to-source voltage of complementary input transistor T2 decreases, input transistor T1 begins sinking the first portion Id1f of the first incremental data current Id1 while the complementary input transistor T2 stops sinking the first portion Ic1f of the first complementary incremental data current Ic1.

Similarly, when the first delayed logic signal Qd1 transitions from a logic high to a logic low and the first delayed complementary logic signal NQd1 transitions from a logic low to a logic high, the gate-to-source voltage of delayed input transistor T4 increases while the gate-to-source voltage of complementary delayed input transistor T5 simultaneously decreases. As above, when the gate-to-source voltage of delayed input transistor T4 increases and the gate-to-source voltage of complementary delayed input transistor T5 decreases, delayed input transistor T4 begins sinking the remaining portion Id1r of the first incremental data current Id1 while complementary delayed input transistor T5 stops sinking the remaining portion Ic1f of the first complementary incremental data current Ic1.

Similarly, second current source 56 and the nth current source 58, both of which are configured as first current source 54, begin sinking the second incremental data current Id2 and the nth incremental data current Idn, respectively, through the output resistor R1 and stop sinking the second complementary incremental data current Ic2 and the nth complementary data current Icn, respectively, through the complementary output resistor R2 in response to their corresponding logic signals Q2/NQ2-Qn/NQn.

Figure 8:
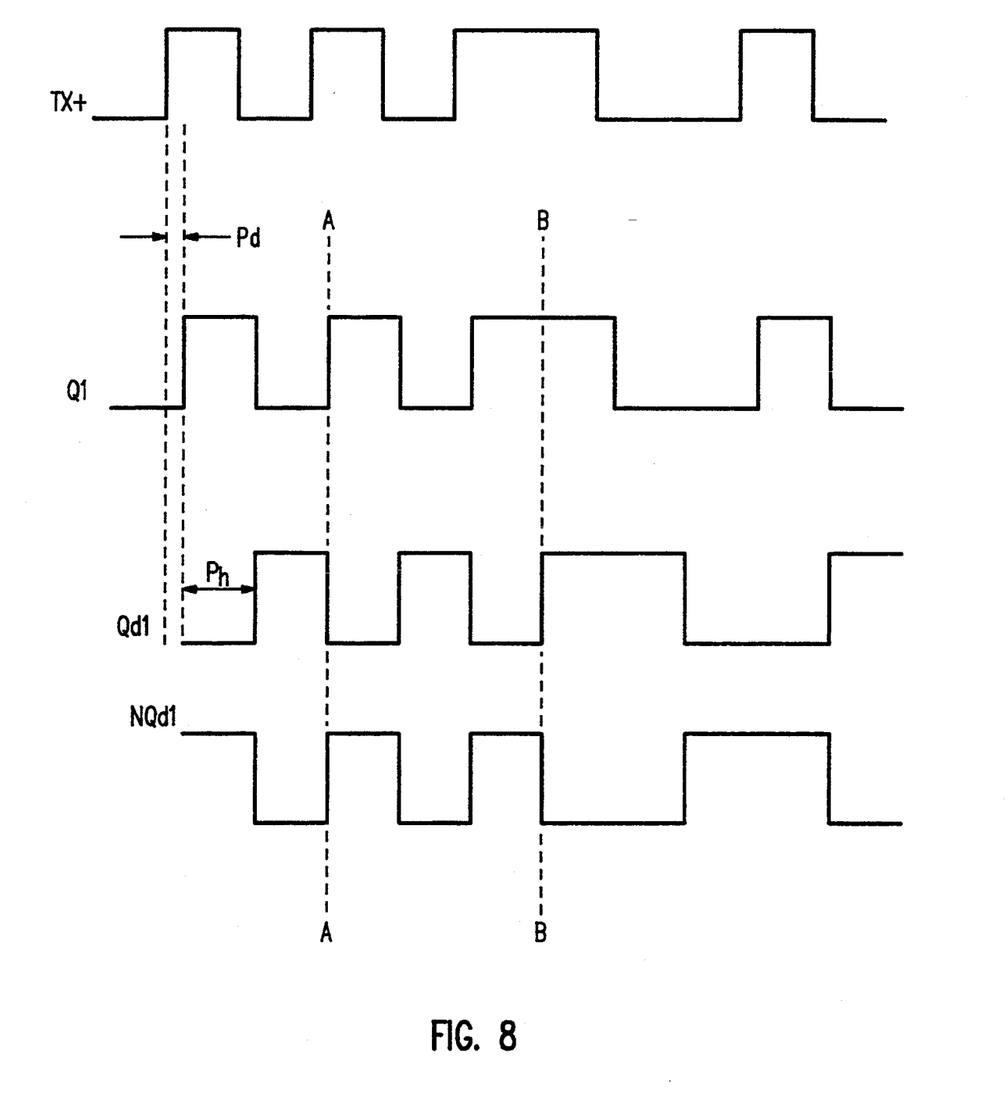
FIG. 8 shows a timing diagram of the input data signal TXO+, the first logic signal Q1, the first delayed logic signal Qd1, and the first complementary delayed logic signal NQd1.

FIG. 8 shows a timing diagram of the input data signal TX+, the first logic signal Q1, the first delayed logic signal Qd1, and the first complementary delayed logic signal NQd1. As shown in FIG. 8, the first logic signal Q1 is delayed by a first propagation delay time Pd introduced by the first inverter gate 28 (see FIG. 4) while the first delayed logic signal Qd1 and the complementary delayed transmit logic signal NQd1 are delayed by the first propagation delay time Pd and the one-half period delay Ph.

As further shown in FIG. 8, at time A, when the logic state of the first logic signal Q1 transitions from a logic low to a logic high, the complementary delayed logic signal NQd1 also transitions from a logic low to a logic high. Thus, at time A, both input transistor T1 and delayed input transistor T4 turn on to sink both the first portion Id1f and the remaining portion Id1r of the first incremental data current Id1.

As further shown in FIG. 8, at time B, the logic state of the first complementary delayed logic signal NQd1 transitions from a logic high to a logic low while the logic state of the first logic signal Q1 remains high. Thus, at time B, input transistor T1 remains on while delayed input transistor T4 turns off.

Since the magnitude of the remaining portion of the first incremental data current Id1 is approximately one-third the magnitude of the first portion of the first incremental data current Id1, as delayed input transistor T4 of each of the current sources sequentially turns off prior to the input transistor T1, a defined amplitude step (see FIGS. 2A-C) is formed in accordance with the IEEE 802.3 specification.

Thus, as the first and each succeeding pair of logic signals sequentially change logic state, an additional incremental current will be sunk through the output resistor R1, thereby producing a decreasing output data signal Vin+, while a reduced incremental current will be sunk through the complementary output resistor R2, thereby producing an increasing complementary output data signal Vin−.

Figure 9A:
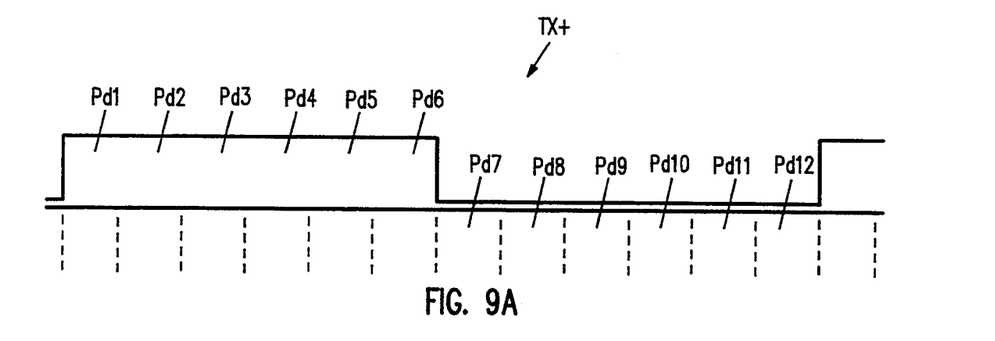
FIG. 9A shows an example of the input data signal TXO+ which has been divided into a first propagation delay period through a twelfth propagation delay period.
Figure 9B:
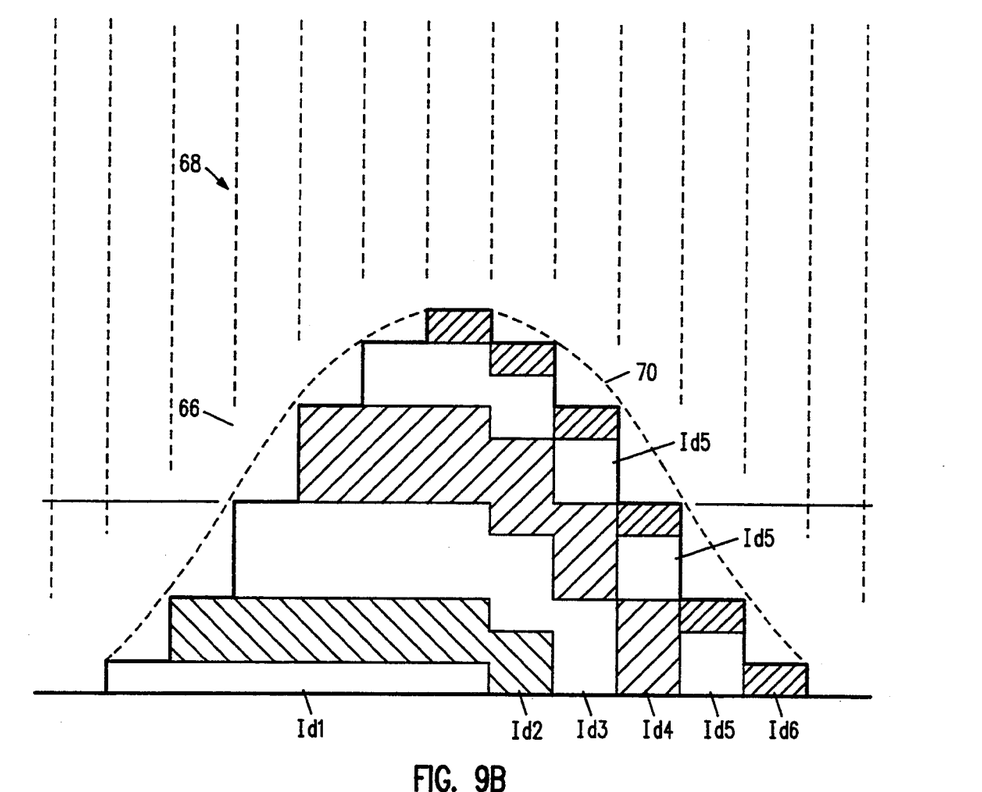
FIG. 9B shows a resulting sine wave 68 which is created by incrementally adding and subtracting the first through the nth incremental data currents.

FIGS. 9A and 9B graphically show an example of the operation of current summing stage 18 based on one half the number of incremental currents and propagation delay periods as utilized in the preferred embodiment. FIG. 9A shows an example of one period of the input data signal TX+ which has been divided into twelve propagation delay periods Pd1-Pd12. As derived from the above, the twelve propagation delay periods Pd1-Pd12 result from utilizing six inverter gates generating 24 transmit logic signals to 6 logic blocks which generate 6 incremental data currents Id1-Id6 and 6 incremental complementary data currents Ic1-Ic6. In the FIG. 9B example, only the operation of the incremental data currents Id1-Id6 are illustrated.

FIG. 9B shows a resulting waveform which is created by incrementally adding and subtracting the six incremental data currents Id1-Id6. As graphically shown in the FIG. 9B example, after the first propagation delay period Pd1, a first incremental data current Id1 represented by one unit of current is generated. As stated above, the first incremental data current Id1 and each of the six succeeding incremental data currents Id2-Id6 are generated for a period of time which is equivalent to one half the period of the input data signal TX+.

After a second propagation delay period Pd2, a second incremental data current Id2 represented by two additional units of additional current is generated. As is graphically depicted in FIG. 9B, the second incremental data current Id2 is added to the first incremental data current Id1. Thus, after the second propagation delay period Pd2, the total data current is represented by three units of current.

After a third propagation delay period Pd3, a third incremental data current Id3 represented by three additional units of current are generated and added to the previous units of current. Thus, after the third propagation delay period Pd3, the total data current is represented by six units of current.

Similarly, after a fourth propagation delay period Pd4, a fifth propagation delay period Pd5, and a sixth propagation delay period Pd5, a fourth, a fifth, and a sixth incremental data currents Id4, Id5, and Id6, respectively, are generated. The fourth, the fifth, and the sixth incremental data currents Id4, Id5, and Id6, which are represented by three additional units, two additional units, and one additional unit of current, respectively, are added to the previous units of current.

Thus, after the sixth propagation delay period Pd6, the total data current is represented by 12 units of current. Therefore, by adding the incremental units of current together, the rising edge 66 of a stepped sine wave 68 is formed.

As further shown in FIG. 9B, after the seventh propagation delay period Pd7, the first incremental data current Id1 is terminated and subtracted from the total data current. Thus, after the seventh propagation delay period Pd7, the total data current is represented by 11 units of current.

Similarly, after the eight propagation delay period Pd8, the second incremental data current Id2 is terminated and subtracted from the total data current. Thus, after the eight propagation delay period Pd8, the total data current is represented by 9 units of current. Therefore, as can be seen in FIG. 9B, a falling edge 70 of the stepped sine wave 68 is formed from the termination of each incremental data current.

As can be seen in FIG. 9B, by increasing both the number of propagation delay periods, and therefore the number of incremental data currents, a more defined sine wave 68 can be generated whereas by reducing both the number of propagation delay periods and the number of incremental data currents, a less defined sine wave 68 can be generated. Thus, the number of propagation delay periods and the number of incremental data currents selected is dependent on the required quality of resulting sine wave 68.

In the present invention, a minimum of eight incremental currents and sixteen propagation delay periods are required to define the resulting sine wave in accordance with the IEEE 802.3 standard. In the preferred embodiment, 12 incremental currents and 24 propagation delay periods are utilized.

Referring again to FIG. 7, the output capacitor C1 and the complementary output capacitor C2, both of which function as low-pass filters, smooth out the stepped sine wave 68 to produce the output data signal Vin+ and the complementary output data signal Vin−.

It should be understood that various alternatives to the structures described herein may be employed in practicing the present invention. It is intended that the following claims define the invention and that structures within the scope of these claims and their equivalents be covered thereby.

What is claimed is:

1. A waveshaping circuit for generating complementary output data signals, the waveshaping circuit comprising:
   a phase-lock-loop stage that generates a plurality of incrementally-delayed timing signals in response to an externally-provided oscillator signal;
   an input stage that generates a plurality of pairs of logic signals in response to the plurality of incrementally-delayed timing signals, each timing signal generating one corresponding pair of logic signals by periodically latching an input data signal so that a logic state and an inverse logic state of the input data signal are simultaneously provided by the corresponding pair of logic signals;
   a delayed input stage that generates a plurality of pairs of delayed logic signals in response to the plurality of incrementally-delayed timing signals, each timing signal generating one corresponding pair of delayed logic signals by periodically latching a delayed input data signal so that a logic state and an inverse logic state of the delayed input data signal are simultaneously provided by the corresponding pair of logic signals, each pair of delayed logic signals corresponding to one pair of logic signals; and
   a weighted current sum stage that generates both the output data signal and the complementary output data signal in response to both the plurality of pairs of logic signals and the plurality of pairs of delayed logic signals, each pair of logic signals and its corresponding pair of delayed logic signals simultaneously generating both an incremental portion of the output data signal and an incremental portion of the complementary output data signal so that an instantaneous value of the output data signal is determined by summing together the incremental portions of the output data signal while an instantaneous value of the complementary output data signal is also determined by summing together the incremental portions of the complementary output data signal.

2. The waveshaping circuit of claim 1 wherein the incremental delay between each of the incrementally-delayed timing signals is substantially equivalent.

3. The waveshaping circuit of claim 2 wherein the phase-lock-loop stage comprises:
   an inverter substage that generates the plurality of incrementally-delayed timing signals in response to both the oscillator signal and a control voltage;
   a phase comparator that generates an error signal in response to a difference between the oscillator signal and one of the plurality of timing signals; and
   a charge pump that generates the control voltage in response to the error signal.

4. The waveshaping circuit of claim 3 wherein the phase-lock-loop stage further comprises an oscillator inverter that generates an inverted oscillator signal in response to the oscillator signal and wherein the phase comparator generates the error signal in response to a difference between the inverted oscillator signal and one of the plurality of timing signals.

5. The waveshaping circuit of claim 4 wherein the inverter substage is comprised of a plurality of serially-connected inverter gates, each inverter gate generating one of the plurality of timing signals.

6. The waveshaping circuit of claim 5 wherein the input stage comprises a plurality of input logic blocks, each input logic block receiving one of the plurality of timing signals and the input data signal and generating one pair of logic signals each time the one timing signal latches the input data signal.

7. The waveshaping circuit of claim 6 wherein the delayed input stage comprises a plurality of delayed input logic blocks, each delayed input logic block receiving one of the plurality of timing signals and the delayed input data signal and generating one pair of delayed logic signals each time the one timing signal latches the delayed input data signal.

8. The waveshaping circuit of claim 7 wherein the weighted current sum stage comprises:
   an output node;
   an output resistor connected between a power supply and the output node;
   a complementary output node;
   a complementary output resistor connected between the power supply and the complementary output node;
   an output capacitor connected between the output node and ground;
   a complementary output capacitor connected between the complementary output node and ground; and
   a plurality of current sources, each current source receiving one of the plurality of pairs of logic signals and its corresponding pair of delayed logic signals and simultaneously generating one of the plurality of incremental output voltages on the first output node and one of the plurality of complementary output voltages on the second output node by sinking either an incremental current through the output resistor or an incremental current through the complementary output resistor in response thereto.

9. The waveshaping circuit of claim 1 wherein the input stage comprises a plurality of input logic blocks, each input logic block receiving one of the plurality of timing signals and the input data signal and generating one pair of logic signals each time the one timing signal latches the input data signal.

10. The waveshaping circuit of claim 9 wherein the delayed input stage comprises a plurality of delayed input logic blocks, each delayed input logic block receiving one of the plurality of timing signals and the delayed input data signal and generating one pair of delayed logic signals each time the one timing signal latches the delayed input data signal.

11. The waveshaping circuit of claim 10 wherein the weighted current sum stage comprises:
   an output node;
   an output resistor connected between a power supply and the output node;
   a complementary output node;
   a complementary output resistor connected between the power supply and the complementary output node;
   an output capacitor connected between the output node and ground;

a complementary output capacitor connected between the complementary output node and ground; and a plurality of current sources, each current source receiving one of the plurality of pairs of logic signals and its corresponding pair of delayed logic signals and simultaneously generating one of the plurality of incremental output voltages on the first output node and one of the plurality of complementary output voltages on the second output node by sinking either an incremental current through the output resistor or an incremental current through the complementary output resistor in response thereto.

12. A method for waveshaping an output data signal and a complementary output data signal, the method comprising the steps of:

generating a plurality of incrementally-delayed timing signals in response to an externally provided oscillator signal;

generating a plurality of pairs of logic signals in response to the plurality of incrementally-delayed timing signals, each timing signal generating one corresponding pair of logic signals by periodically latching an input data signal so that a logic state and an inverse logic state of the input data signal are simultaneously provided by the corresponding pair of logic signals;

generating a plurality of pairs of delayed logic signals in response to the plurality of incrementally-delayed timing signals, each timing signal generating one corresponding pair of delayed logic signals by periodically latching a delayed input data signal so that a logic state and an inverse logic state of the delayed input data signal are simultaneously provided by the corresponding pair of logic signals, each pair of delayed logic signals corresponding to one pair of logic signals; and generating both the output data signal and the complementary output data signal in response to both the plurality of pairs of logic signals and the plurality of pairs of delayed logic signals, each pair of logic signals and its corresponding pair of delayed logic signals simultaneously generating both an incremental portion of the output data signal and an incremental portion of the complementary output data signal so that an instantaneous value of the output data signal is determined by summing together the incremental portions of the output data signal while an instantaneous value of the complementary output data signal is also determined by summing together the incremental portions of the complementary output data signal.

13. A waveshaping circuit for generating complementary output data signals, the waveshaping circuit comprising:

an input stage that generates a plurality of pairs of logic signals within each period of a data signal in response to the data signal and a plurality of timing signals, the data signal and the timing signals having a phase relationship;

a delayed input stage that generates a plurality of pairs of delayed logic signals within each period of a delayed data signal in response to the delayed data signal and the timing signals, the delayed data signal and the timing signals having a phase relationship, each pair of delayed logic signals corresponding to one pair of logic signals; and a weighted current sum stage that generates the complementary output data signals as a first weighted data signal and a second weighted data signal, respectively, in response to both the plurality of pairs of logic signals and the plurality of pairs of delayed logic signals, each pair of logic signals controlling generation of both a first incremental portion of the first weighted data signal and a first incremental portion of the second weighted data signal, each pair of delayed logic signals controlling generation of both a second incremental portion of the first weighted data signal and a second incremental portion of the second weighted data signal, whereby an instantaneous value of the first weighted data signal is determined by summing together all of the incremental portions of the first weighted data signal while an instantaneous value of the second weighted data signal is determined by summing together all of the incremental portions of the second weighted data signal.

14. A waveshaping circuit for generating complementary output data signals, the waveshaping circuit comprising:

an input stage that generates a plurality of pairs of logic signals within each period of a data signal in response to the data signal and a plurality of timing signal edges, the data signal and the plurality of timing signal edges having a phase relationship;

a delayed input stage that generates a plurality of pairs of delayed logic signals within each period of a delayed data signal in response to the delayed data signal and the plurality of timing signal edges, the delayed data signal and the plurality of timing signal edges having a phase relationship, each pair of delayed logic signals corresponding to one pair of logic signals; and a weighted current sum stage that generates the complementary output data signals as a first weighted data signal and a second weighted data signal, respectively, in response to both the plurality of pairs of logic signals and the plurality of pairs of delayed logic signals, each pair of logic signals controlling generation of both a first incremental portion of the first weighted data signal and a first incremental portion of the second weighted data signal, each pair of delayed logic signals controlling generation of both a second incremental portion of the first weighted data signal and a second incremental portion of the second weighted data signal, whereby an instantaneous value of the first weighted data signal is determined by summing together all of the incremental portions of the first weighted data signal while an instantaneous value of the second weighted data signal is determined by summing together all of the incremental portions of the second weighted data signal.

* * * * *